United States Patent [19]

Katto et al.

[11] Patent Number: 4,717,684
[45] Date of Patent: Jan. 5, 1988

[54] SEMICONDUCTOR INTEGRATED CIRCUIT DEVICE

[75] Inventors: Hisao Katto, Hinode; Kousuke Okuyama, Tachikawa, both of Japan

[73] Assignee: Hitachi, Ltd., Tokyo, Japan

[21] Appl. No.: 825,587

[22] Filed: Feb. 3, 1986

[30] Foreign Application Priority Data

Feb. 1, 1985 [JP] Japan .................................. 60-16508

[51] Int. Cl.4 .......................................... H01L 21/265
[52] U.S. Cl. ......................................... 437/34; 437/40; 437/57; 437/200; 437/229; 437/933
[58] Field of Search ................. 29/571, 577 C, 576 C, 29/576 B; 148/DIG. 82, DIG. 83; 357/23.6, 42, 23.4, 23.8, 23.13

[56] References Cited

U.S. PATENT DOCUMENTS

| | | | |
|---|---|---|---|
| 3,731,161 | 5/1973 | Yamamoto | 357/41 |
| 4,172,260 | 10/1979 | Okabe et al. | 357/51 |
| 4,298,401 | 11/1981 | Nucz et al. | 148/1.5 |
| 4,325,180 | 4/1982 | Curran | 357/23.4 |
| 4,356,623 | 11/1982 | Hunter | 29/571 |
| 4,399,451 | 8/1983 | Shirai | 357/51 |
| 4,466,177 | 8/1984 | Chao | 357/51 |
| 4,475,280 | 10/1984 | Ragonese et al. | 29/578 |
| 4,502,205 | 3/1985 | Yahamo | 29/571 |
| 4,575,920 | 3/1986 | Tsunashima | 29/576 B |
| 4,577,391 | 3/1986 | Hsia et al. | 357/42 |
| 4,590,663 | 5/1986 | Haken | 29/576 B |
| 4,628,341 | 12/1986 | Thomas | 357/23.4 |
| 4,637,124 | 1/1987 | Okuyama et al. | 29/571 |
| 4,656,492 | 4/1987 | Sunami et al. | 357/23.8 |

FOREIGN PATENT DOCUMENTS 0043284 1/1982 European Pat. Off. .
0072759 4/1984 Japan .

OTHER PUBLICATIONS

Ralhmam, "An Optimized 0.5 Micron LDD Transistor", IEDM, 1983, pp. 237-239.
Oguna, "Design and Characteristics of the Lightly Doped Drain-Source (LDD) Insulated Gate Field-Effect Transistor" IEEE Trans. on Electron Devices, ED 27, Aug. 80, pp. 1359-1367.
Tsang, "Fabrication of High Performance LDDFETS with Oxide Sidewall-Spacer Technology," IEEE Journal of Solid State Circuits, vol. SC-17, No. 2, Apr. 82, pp. 220-226.

Primary Examiner—Brian E. Hearn
Assistant Examiner—Tom Thomas
Attorney, Agent, or Firm—Antonelli, Terry & Wands

[57] ABSTRACT

A semiconductor integrated circuit device wherein the source and drain regions of a MOSFET in an internal circuit have lightly doped drain (LDD) structures in order to suppress the appearance of hot carriers, and the source and drain regions of a MOSFET in an input/output circuit have structures doped with phosphorus at a high impurity concentration, in order to enhance an electrostatic breakdown voltage.

29 Claims, 15 Drawing Figures

SEMICONDUCTOR INTEGRATED CIRCUIT DEVICE

BACKGROUND OF THE INVENTION

The present invention relates to semiconductor integrated circuit devices, and more particularly to a semiconductor integrated circuit device in which a measure against hot carriers and a measure against electrostatic breakdown are taken, and whose internal circuit has a MOS field effect transistor of the LDD (Lightly Doped Drain) structure, as well as a method of manufacturing the same.

In a semiconductor device, especially a microminiaturized semiconductor device, comprising metal-oxide-semiconductor field effect transistors (MOSFETs), it is proposed to employ the LDD structure for a source and a drain to the end of preventing the appearance of hot carriers. With the LDD structure, source and drain regions are each constructed of a high impurity concentration region formed away from a gate electrode (hereinbelow, expressed as 'formed in offset to a gate electrode'), and of a low impurity concentration region disposed between the high impurity concentration region and the gate electrode. Owing to the LDD structure, the electric field of a drain edge in the direction of a channel is relaxed, with the result that the appearance of hot carriers is suppressed. Thus, the degradations of element characteristics attributed to the hot carriers can be restrained, to enhance reliability. In case of, for example, an N-channel MOSFET (hereinbelow, termed 'NMOSFET'), the low impurity concentration region mentioned above is set at a concentration on the order of, e.g., $10^{13}$ cm$^{-2}$ and, e.g., at a length of 0.2-0.4 μm.

The LDD is described in P. J. Tsang et al, *IEEE Transactions on Electron Devices*, Vol. ED-29, No. 4 (1982), p. 590.

SUMMARY OF THE INVENTION

Using the LDD structure, the inventors manufactured D-RAMs (Dynamic-RAMs), etc., by way of trial. Based on such trials, it has been found that electrostatic breakdown voltages in input/output circuits are a problem. That is, in a case where an element of the LDD structure is utilized as an element in circuitry, such as an input or output circuit, to which external electrostatic energy is directly applied, particularly as an input protective element, the breakdown or destruction of a gate insulator film is induced even by a comparatively low electrostatic energy. A cause therefor is that, since a voltage with which the input protective element turns 'on' is raised by the presence of the low inpurity concentration region, a voltage to act on the gate insulator film becomes higher, resulting in a lower electrostatic breakdown voltage.

The inventors therefore performed repeated studies, and have found out the following.

As regards the prevention of hot carriers, it is more effective to make the low impurity concentration regions of the source and drain regions of a MOSFET for the input or output circuit out of phosphorus than to make them out of only arsenic. Further, in a case where the source and drain regions of the MOSFET of the input or output circuit are formed by utilizing phosphorus used for the low impurity concentration region of the LDD structure, the impurity concentration is not satisfactory. That is, the voltage with which the protective element turns 'on' becomes high. Besides, in a case where phosphorus at a high concentration is introduced into a substrate by an ordinary method (a method employing a gate electrode as a mask) in order to form the source and drain regions, an effective channel length under a gate (gate effective length) becomes small because the diffusion rate of phosphorus is great. When it is intended to cope with this drawback, the length of the gate increases, contrariwise to the microminiaturization of the semiconductor device. Of course, hot carriers appear with the construction which uses only arsenic for the formation of the source and drain regions.

Accordingly, an object of the present invention is to enhance the breakdown or destruction voltage of a MOS type semiconductor integrated circuit device.

Another object of the present invention is to provide a semiconductor device which can enhance an electrostatic breakdown or destruction (ESD) voltage in a semiconductor device employing a MOSFET of the LDD structure in its internal circuit and, particularly, including a MOSFET as an element in circuitry such as an input or output circuit to which external electrostatic energy is to be directly applied.

Another object of the present invention is to provide a semiconductor device which renders the appearance of hot carriers difficult while enhancing an electrostatic breakdown voltage.

A further object of the present invention is to provide a semiconductor device which can achieve a rise in the operating speed of an element without increasing the resistances of source and drain regions.

Still another object of the present invention is to provide a method of manufacturing a semiconductor device which can produce the aforementioned semiconductor device readily without drastically altering a manufacturing process for a semiconductor device of the LDD structure.

The above-mentioned and other objects and novel features of the present invention will become apparent from the description of this specification and the accompanying drawings.

Typical aspects of performance of the present invention will be briefly summarized below.

The input or output circuit of a semiconductor device employing a MOSFET of the LDD structure in its internal circuit is constructed of a MOSFET of a structure in which source and drain regions are doped with phosphorus at a high concentration. Thus, enhancement in an electrostatic destruction voltage is achieved, while the appearance of hot carriers is rendered difficult.

Further, phosphorus at a high concentration is introduced in such a way that side wall spacers formed on both the sides of a gate electrode are used as a mask during such introduction. Thus, notwithstanding that the diffusion rate of phosphorus is great, source and drain regions which overlap the gate electrode at most only a little can be formed. As the step of forming the side wall spacers, the step of forming side wall spacers for the LDD structure of the internal circuit can be utilized as it is, so that a sharp increase in the number of steps is not involved.

DESCRIPTION OF THE PREFERRED EMBODIMENTS

Figure 1:
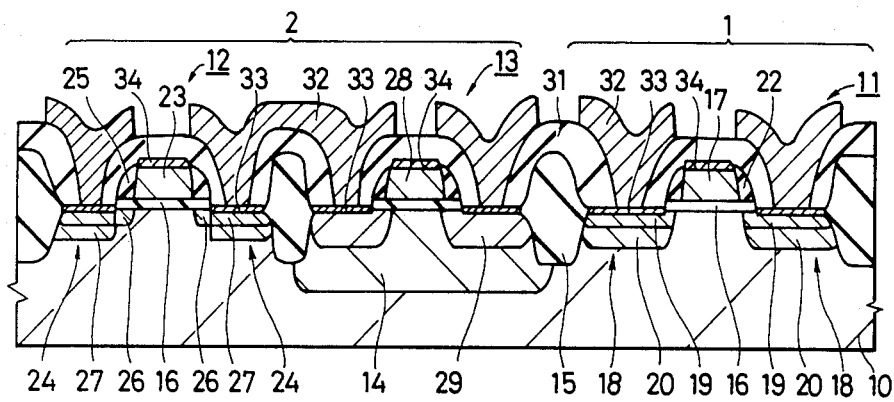
FIG. 1 is a sectional view showing an embodiment of the present invention.

FIG. 1 shows an embodiment in which the present invention is applied to a semiconductor device, for example, a D-RAM constructed of complementary MOSFETs. A region 1 is a region (input/output circuit region) in which an element for an input/output circuit is formed, while a region 2 is a region (internal circuit region) in which elements constituting an internal circuit other than a memory cell are formed. The figure illustrates the sections of the respective elements.

An NMOSFET 11 is formed as an element of the input/output circuit 1 on a semiconductor substrate 10 made of a P-type silicon single crystal. An NMOSFET 12 and a P-channel MOSFET (hereinbelow, termed 'PMOSFET') 13 are respectively formed as elements of the internal circuit 2 on the substrate 10 and an N-type well 14 provided therein. The individual MOSFETs are insulated from one another by a field insulator film (SiO$_2$) 15 which is an element isolating insulator film.

The NMOSFET 11 comprises a gate electrode 17 made of polycrystalline silicon, which is formed on a gate insulator film (SiO$_2$) 16, and N-type regions 18 as source and drain regions, which are provided in the main surface of the substrate 10. Side wall spacers (insulator films) 22 made of SiO$_2$ are formed on both the sides of the gate electrode 17 by, e.g., depositing a layer of SiO$_2$ on the substrate by the low-pressure CVD (chemical vapor deposition) process and then etching such SiO$_2$ layer by, e.g., reactive ion etching to form the side wall spacers, as is known in the art. However, the MOSFET 11 has no LDD structure. Each of the N-type regions 18 is composed of a region (low concentration phosphorus region) 19 which is doped with phosphorus at a low concentration, and a region (high concentration phosphorus region) 20 which is doped with phosphorus at a high concentration. In the case of this example, the concentrations of the respective phosphorus regions 19 and 20 are $10^{13}$ cm$^{-2}$ (approximately $1 \times 10^{18}$ cm$^{-3}$) or less and $1$–$10 \times 10^{15}$ cm$^{-2}$. In particular, the phosphorus region 20 is set at a concentration of $1$–$20 \times 10^{19}$ cm$^{-3}$ or above. The concentration of the phosphorus region 20 needs to be, at least, higher than that of a phosphorus region 26 to be described later. The inventors have verified that, even when the phosphorus regions of such a high concentration are used as the source and drain regions, the appearance of hot carriers is at most only a little, while a strength against electrostatic destruction increases, as will be stated later. In addition, the depths of junctions which the respective regions 19 and 20 define with the substrate 10 are set to 0.2 μm and 0.5 μm. The high concentration phosphorus regions 20 have their inner ends diffused to positions under both the ends of the gate electrode 17, into the shape in which they encompass the low concentration phosphorus regions 19 therein.

The NMOSFET 12 comprises a gate electrode 23 made of polycrystalline silicon on a gate insulator film 16, and N-type regions 24 as source and drain regions. Side wall spacers 25 are formed on both the sides of the gate electrode 23. Each of the N-type regions 24 is composed of the low concentration phosphorus region 26, and a region (arsenic region) 27 which is doped with arsenic at a high concentration. In particular, the arsenic region 27 is formed so as to be apart (spaced) from a projection of the gate electrode 23 in the main surface of the substrate 10 by the side wall spacer 25, and the low concentration phosphorus region 26 is formed so as to extend under the side wall spacer 25. Thus, the so-called LDD structure is established. The concentration of the low concentration phosphorus region 26 is at most $10^{13}$ cm$^{-2}$ (approximately $1 \times 10^{18}$ cm$^{-3}$), and that of the arsenic region 27 is $5$–$10 \times 10^{15}$ cm$^{-2}$ ($1$–$4 \times 10^{20}$ cm$^{-3}$). The depths of junctions which the respective regions 26 and 27 define with the substrate 10 are 0.2 μm and 0.2–0.3 μm.

The PMOSFET 13 comprises a gate electrode 28 made of polycrystalline silicon on a gate insulator film 16, and P-type regions 29 as source and drain regions formed in the N-type well 14. In this example, the PMOSFET 13 is not of the LDD structure. The P-type regions 29 are formed by doping with boron at a concentration of approximately $5 \times 10^{15}$ cm$^{-2}$.

Layers 33 and 34 of a silicide of platinum or a refractory metal are respectively formed on the surfaces of the source and drain regions 18, 24 and 29 and the gate electrodes 17, 23 and 28. In the figure, numeral 31 designates an inter-layer insulator film which is made of phosphosilicate glass (PSG) or the like, the numeral 32 a wiring layer which is made of aluminum.

Figure 6:
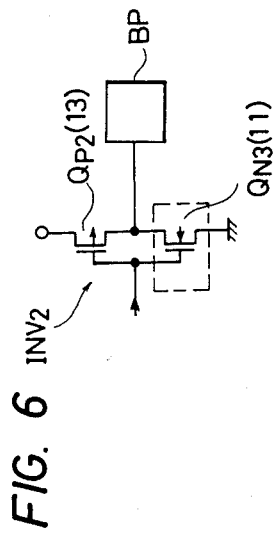
FIGS. 5 and 6 are circuit diagrams showing, respectively, examples of input and output circuits to which the present invention is applied.
Figure 5:
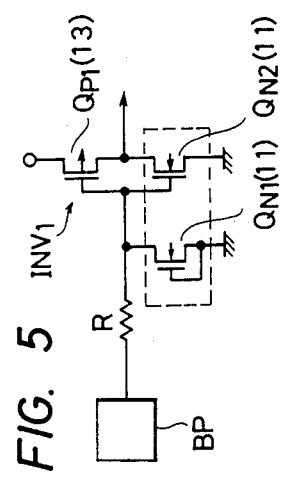

FIG. 5 is a diagram showing an input circuit, while FIG. 6 is a diagram showing an output circuit, and they exemplify the input/output circuits 1 respectively. As seen from FIGS. 5 and 6, the input/output circuits 1 are circuits which are connected to bonding pads BP. NMOSFETs $Q_{N1}$–$Q_{N3}$ and PMOSFETs $Q_{P1}$, $Q_{P2}$ are respectively put into the same structures as those of the NMOSFET 11 and the PMOSFET 13. The internal circuit 2 includes a portion except for the input/output circuits 1 and the memory cell, in other words, a circuit such as decoder, sense amplifier, main amplifier or any of various signal generators.

In the present embodiment, the NMOSFET of the memory cell is put into the same structure as that of the NMOSFET 12.

According to this construction, in the NMOSFET 12 in the internal circuit 2, the N-type region 24 is formed into the LDD structure by the arsenic region 27 and the low concentration phosphorus region 26, so that an electric field at the edge of the drain region 24 can be moderated so as to suppress the appearance of hot carriers. As a result, fluctuation of a threshold voltage can be prevented so as to enhance the reliability of characteristics in the internal circuit 2.

On the other hand, in the NMOSFET 11 of the input/output circuit 1, the source or drain region (N-type region) 18 is formed of the high concentration phosphorus region 20 encompassing the low concentration phosphorus region 19, so that the reverse breakdown voltage of the junction between the high concentration phosphorus region 20 and the substrate 10 becomes small. Thus, the destruction voltage of the gate insulator film against electrostatic destruction can be enhanced.

By setting the source and drain regions 18 at the high impurity concentration, the electric field strength is raised. Since, however, the impurity is phosphorus, the impurity concentration gradient is gentle, and hence, the appearance of hot carriers as in the case of arsenic is not involved. Of course, in the input/output circuits, the influences of the hot carriers are originally only a little on the basis of the relations between element sizes and voltages to be applied.

Further, owing to the use of the silicide layer 33, it is possible to reduce the resistance of the semiconductor region 18 and to rasie the operating speed of the element even when phosphorus is employed as the impurity.

Next, a method of manufacturing the semiconductor device of the above construction will be described with reference to FIGS. 2A-2G.

Figure 2A:
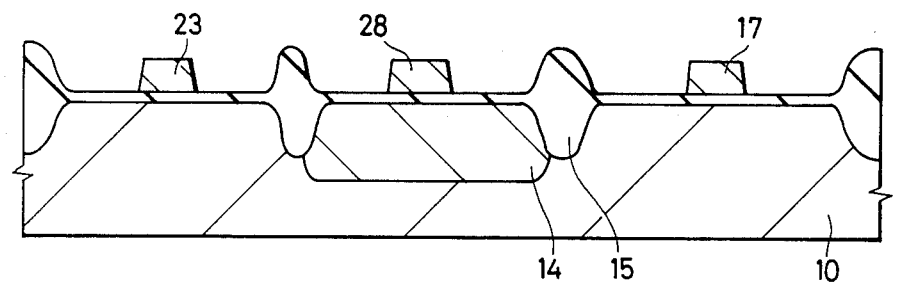
FIGS. 2A-2G are sectional views showing a manufacturing process for the embodiment in FIG. 1.

First, as shown in FIG. 2A, an N-type well 14 is formed in a semiconductor substrate 10 made of a P-type silicon single crystal, and an element isolating insulator film (field insulator film) 15 and a gate insulator film 16 are formed. Polycrystalline silicon is deposited on the whole surface of the substrate by CVD and is patterned to form gate electrodes 17, 23 and 28 of respective MOSFETs 11, 12 and 13.

Figure 2B:
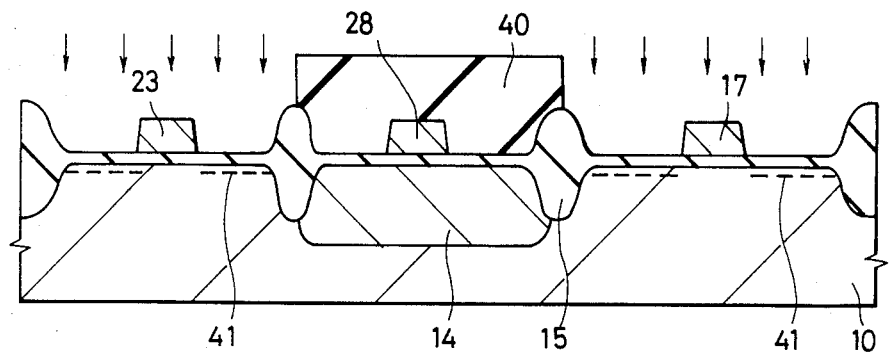

Subsequently, as shown in FIG. 2B, under the state under which the portion of the substrate for forming the PMOSFET 13 is masked by a photoresist film 40, phosphorus at a low concentration ($10^{13}$ cm$^{-2}$ or less) is ion-implanted into the whole surface by employing the gate electrodes 17 and 23 as a mask. As an example, the phosphorus can be ion-implanted at a concentration of $1 \times 10^{13}$ cm$^{-2}$ and an implantation energy of 60 KeV. Thus, low-concentration ion-implanted layers 41 are formed. At this time, an input/output circuit domain 1 may well be covered with the photoresist film 40 so as to prevent the phosphorus from being introduced into the source and drain regions of the NMOSFET 11.

Figure 2C:
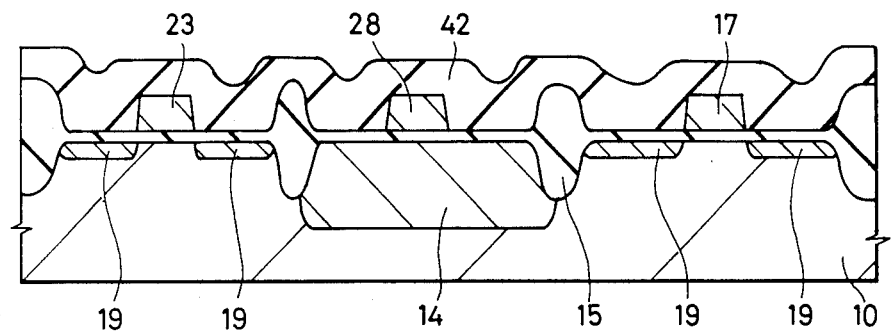

After removing the photoresist film 40, the resultant structure is annealed thereby to form low concentration phosphorus regions 19 and 26 in the respective NMOSFETs 11 and 12 as shown in FIG. 2C. Such annealing can be performed, for example, at a temperature of 950° C., in a nitrogen (N$_2$) atmosphere, for 10-30 minutes. An SiO$_2$ film 42 is formed on the whole surface of the substrate by the low-pressure CVD process or the like.

Figure 2D:
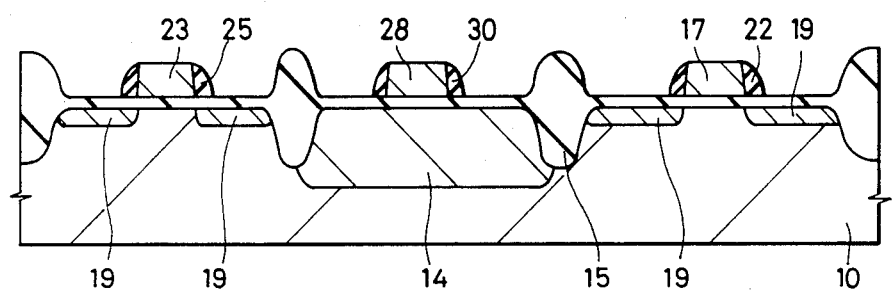

The SiO$_2$ film 42 is etched by reactive ion etching (RIE), whereby side wall spacers 22, 25 and 30 are respectively formed on both sides of the gate electrodes 17, 23 and 28, as shown in FIG. 2D.

Figure 2E:
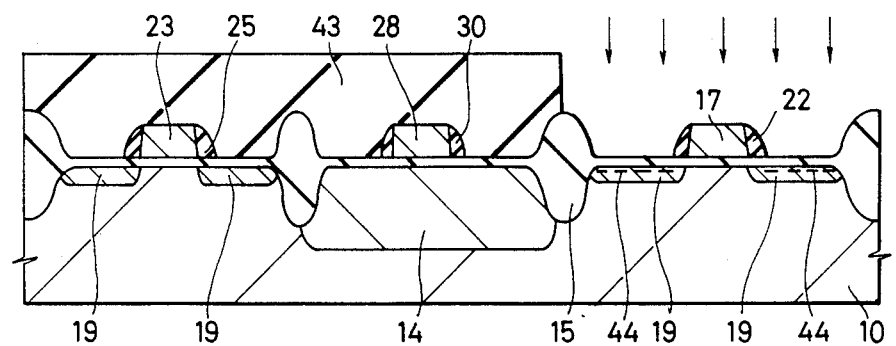

Next, as shown in FIG. 2E, under the state under which an internal circuit region 2, namely, the portion of the substrate for forming the NMOSFET 12 as well as the portion of the substrate for forming the PMOSFET 13, is masked by a photoresist film 43, phosphorus at a high concentration ($1-10 \times 10^{15}$ cm$^{-2}$) is ion-implanted by employing the gate electrode 17 and the side wall spacers 22 as a mask. As an example, phosphorus can be ion-implanted at a high concentration of $5 \times 10^{15}$ cm$^{-2}$, at an implantation energy of 100 KeV. Thus, layers 44 ion-implanted with the high concentration of phosphorus are formed.

Figure 2F:
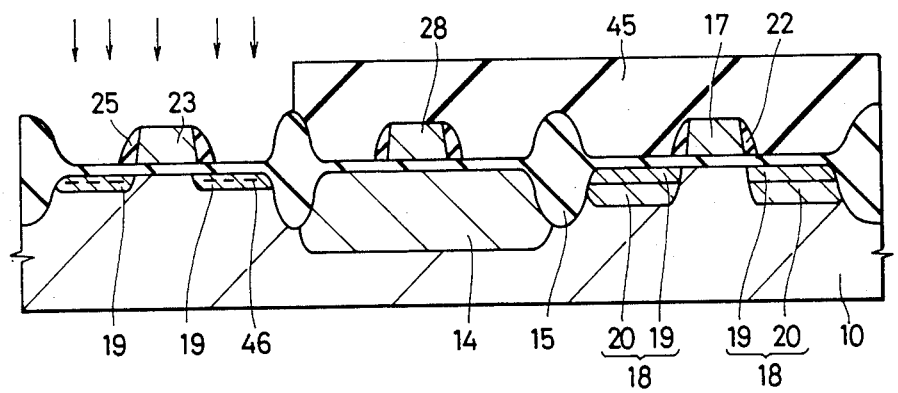

After removing the photoresist film 43, the resultant structure is annealed, by a conventional technique (e.g., annealing is performed at 950° C. in a nitrogen (N$_2$) atmosphere for 10-30 minutes), thereby to form source and drain regions 18 made up of high concentration phosphorus regions 20 encompassing the low concentration phosphorus regions 19 as shown in FIG. 2F.

Alternatively, the phosphorus for the high concentration phosphorus regions 20 can be implanted without use of side wall spacers 22, and, particularly, prior to forming the side wall spacers 22. Thus, layers 44 can be ion-implanted before or after forming low concentration phosphorus regions 19 (e.g., prior or after ion-implanting layers 41), without the side wall spacers. Thus, layers 44 can be ion-implanted in the state of FIG. 2B. In this case, since the regions 20 diffuse from an edge of gate electrode 17 and include regions 19, even if layers 44 are implanted to make a shallow junction, the implantation energy for forming layers 44 can be reduced to, e.g., 50 KeV.

Thereafter, as shown in FIG. 2F, under the state under which the portion of the substrate for forming PMOSFET 13 and the input/output circuit region 1 are masked by a photoresist film 45, arsenic is ion-implanted at a concentration of $5-10 \times 10^{15}$ cm$^{-2}$ by employing the gate electrode 23 and the side wall spacers 25 as a mask. As an example, arsenic can be ion-implanted at such concentration of $5-10 \times 10^{15}$ cm$^{-2}$ and an implantation energy of 80 KeV. Thus, arsenic ion-implanted layers 46 are formed for the NMOSFET 12.

Figure 2G:
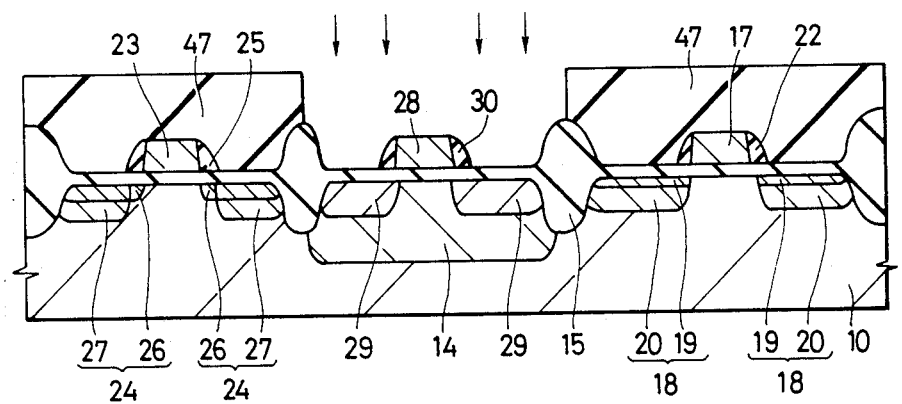

By annealing after the removal of the photoresist film 45, using conventional annealing as discussed previously, arsenic regions 27 are formed as shown in FIG. 2G. That is, the source and drain regions 24 of the NMOSFET 12 of the internal circuit 2 are finished up as the LDD structures.

Subsequently, as shown in FIG. 2G, under the state under which the NMOSFETs 11 and 12 are masked by a photoresist film 47, boron (B) is ion-implanted at a concentration of $5 \times 10^{15}$ cm$^{-2}$ by employing the gate electrode 28 and the side wall spacers 30 as a mask. As an example, BF$_2$ can be ion-implanted at a concentration of $5 \times 10^{15}$ cm$^{-2}$ at an implantation energy of 60-80 KeV. Thus, boron-implanted layers are formed. By annealing (e.g., conventional annealing, as discussed previously) after the removal of the photoresist film 47, P$^+$-type regions 29 as source and drain regions are formed. Thereafter, the parts of the insulator film 16 on the source and drain regions are removed. Subsequently, a metal film of molybdenum (Mo) or the like (e.g., other refractory metals, and platinum) is formed on the whole surface of the resultant substrate and is heat-treated into a silicide, and the unreacted parts of the metal film are removed, whereby silicide layers 33 and 34 are formed, as is known in the art.

As an alternative annealing technique to the aforementioned separate annealing after each ion-implantation, the structure can be subjected to an annealing after all ion-implantations have been completed. In such alternative technique, the annealing, performed, e.g., at 950° C. in a nitrogen (N$_2$) atmosphere, should be performed for 30-60 minutes.

Thenceforth, an inter-layer insulator film 31, aluminum wiring 32 and final passivation film (not shown) are formed by well-known processes, whereby the semiconductor device in FIG. 1 can be completed.

With this method, the NMOSFET of the input/output circuit can be readily formed merely by adding the masking step of the photoresist film 43 and the doping step of the high concentration phosphorus as shown in FIG. 2E, to the steps of fabricating the NMOSFET (12) of the LDD structure. Besides, in forming the high concentration phosphorus regions 20, the side wall spacers 22 are utilized, and hence, the high concentration phosphorus regions 20 can be formed into a required depth. Also, the channel length can be readily formed into a required length, and an increase in the channel length is not incurred, which is effective for microminiaturization.

Figure 3:
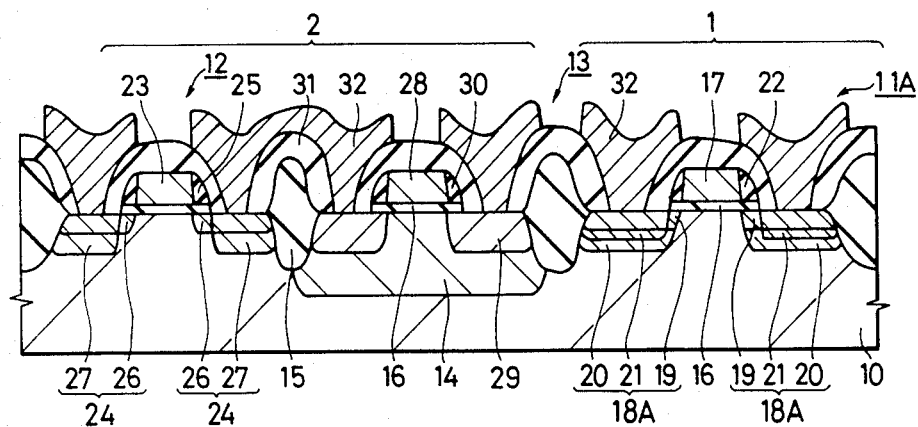
FIG. 3 is a sectional view of another embodiment of the present invention.

FIG. 3 shows another embodiment of the present invention. In the figure, the same portions as in FIG. 1 are assigned the same symbols, and they shall not be repeatedly explained.

In this example, each of N-type regions 18A as the source and drain regions of the NMOSFET 11A of an input/output circuit 1 comprises a low concentration phosphorus region 19, a high concentration phosphorus region 20 so as to substantially encompass the region 19, and an arsenic region 21 which is formed on the surface side of the region 20 and shallower than this region 20 and to be apart from a gate electrode 17 (that is, spaced from a vertical projection of gate electrode 17 on the substrate). The concentrations of the phosphorus regions 19 and 20 are the same as in the foregoing example, and the concentration of the arsenic region 21 is the same as that of the arsenic region 27 of the NMOSFET 12 of an internal circuit 2. The depths of the respective regions 19, 20 and 21 are 0.2 $\mu$m, 0.5 $\mu$m and 0.2–0.3 $\mu$m.

Figure 4A:
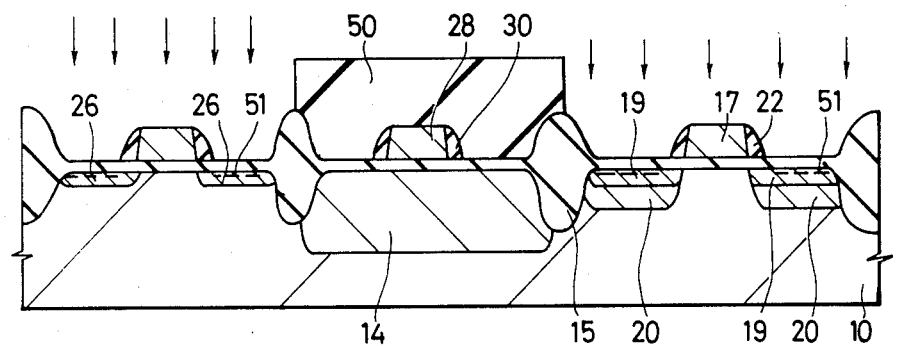
FIGS. 4A and 4B are sectional views showing some steps of a manufacturing process for the embodiment in FIG. 3.

A method of manufacturing this semiconductor device is as follows. First, the steps of FIG. 2A–FIG. 2E in the foregoing example are carried out. Thereafter, as shown in FIG. 4A, under the state under which only the portion of the substrate for forming PMOSFET 12 of the internal circuit 2 is covered with a mask of photoresist 50, arsenic is ion-implanted at a concentration of $5-10 \times 10^{15}$ cm$^{-2}$, at an implantation energy of, e.g., 80 KeV. Arsenic ion-implanted layers 51 formed for both the NMOSFETs 11A and 12 are annealed, and the arsenic regions 21 and 27 being apart with respect to the corresponding gate electrodes 17 and 23 can be formed. Thus, the above-stated construction of the source and drain regions 18A is obtained in the NMOSFET 11A, and the LDD structures are obtained in the NMOSFET 12.

Figure 4B:
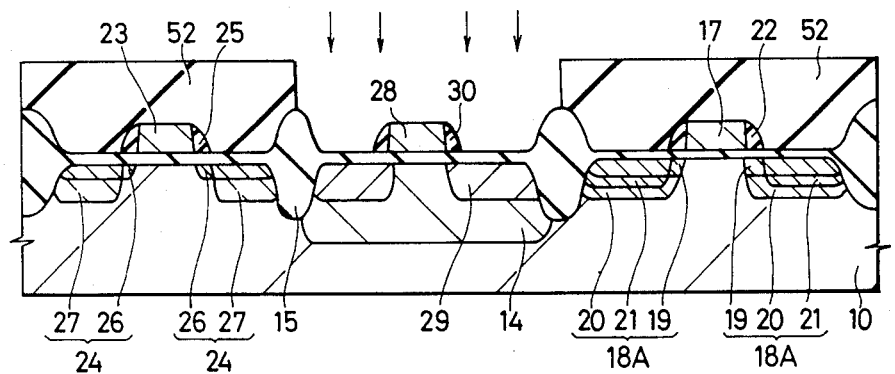

Subsequently, as shown in FIG. 4B, the NMOSFETs 11A and 12 are masked by the use of a photoresist film 52, and if necessary, side wall spacers 30 are etched and removed, whereupon boron is ion-implanted. By subsequent annealing, source and drain regions 29 are formed.

Thereafter, an inter-layer insulator film 31, aluminum wiring 32 and final passivation film are formed, whereby the semiconductor device in FIG. 3 is finished up.

According to this example, the NMOSFET 12 of the internal circuit 2 is formed in the LDD construction as in the preceding example, so that the appearance of hot carriers is suppressed. On the other hand, in the NMOSFET 11A of the input/output circuit, the main constituents of the source and drain regions 18A are the high concentration phosphorus regions 20 extended to both the ends of the gate electrode 17, so that the electrostatic destruction voltage can be enhanced. Moreover, the regions 20 have a high impurity concentration but use phosphorus, so that lowering of the hot carrier generation can be suppressed.

Further, since arsenic regions 21, which are spaced apart from the projection of the gate electrode, are included in the source and drain regions 18A, the overlap of the high concentration phosphorus regions 20 with the gate electrode 17 can be made smaller than in the preceding example, and the transconductance can be enhanced owing to reduction in the junction capacitances. Of course, the operating speed can also be raised by the lowered resistances of the source and drain regions 18A owing to the arsenic regions 21.

Even in a case where the high concentration phosphorus regions 20 do not get to both sides of the gate electrode 17, the low concentration phosphorus regions 19 previously formed have been formed by utilizing the gate electrode 17 and reliably extend to under this gate electrode, so that the MOS structure is not spoiled.

According to the present invenion, the following effects are produced.

In a semiconductor device whose internal circuit has a MOSFET of the LDD structure, the source and drain regions of a MOSFET for an input/output circuit are so constructed as to be doped with phosphorus at a high concentration, so that the electrostatic destruction voltage can be enhanced.

Since source and drain regions are constructed by the use of phosphorus at a high concentration, the concentration gradient is gentle in spite of the high impurity concentration, and the appearance of hot carriers can be suppressed.

Since the concentration of phosphorus in the input/output circuit is made as high as $1-20 \times 10^{19}$ cm$^{-3}$, the appearance of hot carriers can be suppressed, and the electrostatic destruction voltage can be enhanced.

Only an input/output circuit is provided with regions made by the use of a high concentration of phosphorus, and other semiconductor devices of the integrated circuit are formed in the LDD structure, so that even when the junction capacitances between a substrate and the phosphorus regions increase, the operating speed of the whole IC does not lower.

Since source and drain regions are formed with arsenic regions, resistances can be reduced to achieve an increased speed.

Since source and drain regions are provided with silicide layers, resistances can be reduced to achieve an even increased speed.

Since source and drain regions are formed with arsenic regions spaced from a projection of a gate electrode, the overlap between phosphorus regions and the gate electrode can be diminished, and junction capacitances can be reduced to enhance a transconductance.

Since the overlap between a gate electrode and high concentration phosphorus regions can be diminished, a gate length relative to an effective gate length is shortened, which is effective for the microminiaturization of an element.

Under the state in which at least an internal circuit is masked, doping with a high concentration of phosphorus is carried out by utilizing side wall spacers, whereupon doping with arsenic is carried out for at least the internal circuit by utilizing the side wall spacers. Thus, the LDD structures can be formed in the internal circuit, and source and drain regions of the high concentration of phosphorus can be formed in an input/output circuit. A semiconductor device of the present invention can be readily manufactured by adding the step of masking, and the step of doping with the high concentration of phosphorus, to a process for manufacturing an NMOSFET of the LDD structure.

An impurity is introduced by doping beforehand with a gate electrode used as a mask. Therefore, even when the diffusion of a high concentration of phosphorus is insufficient in case of doping with the high concentration of phosphorus, the MOS structure is not spoiled.

While, in the above, the invention made by the inventors has been concretely described in conjunction with embodiments, it is needless to say that the present invention is not restricted to the foregoing embodiments but that it can be variously modified within a scope not departing from the purport thereof.

The present invention is effective for a MOSFET, e.g., $Q_{N1}$ or $Q_{N3}$ (see FIGS. 5 and 6) whose drain is connected to a bonding pad, especially a bonding pad to which an input or output signal is applied. The reason is that electrostatic breakdown is liable to occur in a circuit connected to the bonding pad to which the input or output signal is applied.

Accordingly, the MOSFET $Q_{N2}$ in FIG. 5 need not be put into the same structure as that of the MOSFET 11. To the contrary, the present invention is also applicable to an NMOSFET constituting a circuit of the next stage which is connected to an inverter $INV_1$ or $INV_2$ constructed of the MOSFET $Q_{N1}$ or $Q_{N3}$. Further, it is possible that only the drain region of an N-channel MOSFET such as the MOSFET $Q_{N1}$ or $Q_{N3}$ is put into the structure conforming with the present invention.

Figure 7:
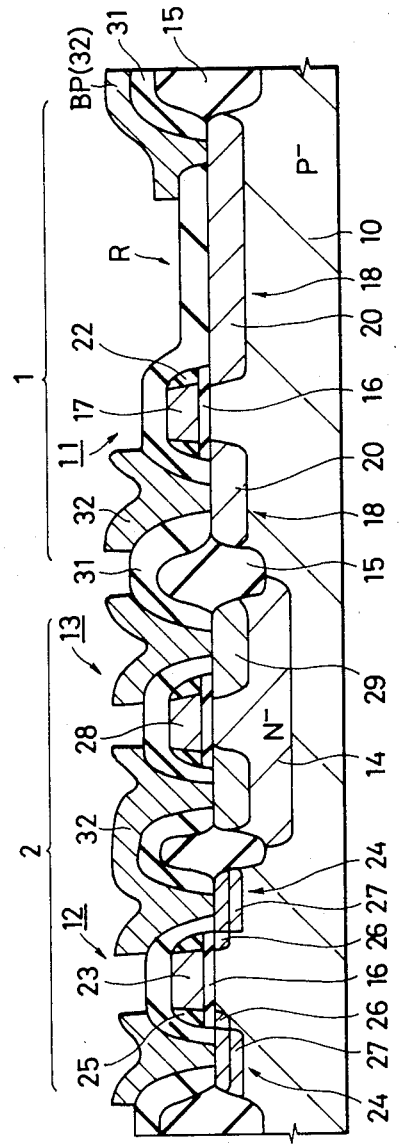
FIG. 7 is a sectional view showing still another embodiment of the present invention.

The low impurity concentration regions 19 in the MOSFET 11 can be omitted. As shown in FIG. 7, each of the source and drain regions 18 of the MOSFET 11 is made up of only the phosphorus region 20 of high impurity concentration. This can be achieved in such a way that the resist mask 40 shown in FIG. 2B is formed so as to cover the input/output circuit domain 1. That is, the number of manufacturing steps does not increase in a CMOSIC. In an IC (NMOSIC) which is constructed of NMOSFETs without having the PMOSFET 13, a masking step needs to be added.

As shown in FIG. 7, the layers 33 and 34 of the silicide of platinum or a refractory metal can be omitted.

An input protective resistor R shown in FIG. 5 can be formed by extending the source or drain region 18 of the MOSFET 11. In case of forming a resistor R made of a semiconductor region which is identical and continuous to the region 18, the structure shown in FIG. 7 is desirable. That is, the source and drain regions 18 of the MOSFET 11 are constructed only of the phosphorus regions 20. The resistor R is formed by extending either phosphorus region 20. In order to bring the sheet resistance of the region 20 to a proper value (the proper value being that presently used in the art), the silicide layer 33 is not formed. For the same reason, at least the arsenic region 27 is not formed. Accordingly, the resistor R can be formed in a small area. One end of the resistor R is connected to the bonding pad BP which is made of the aluminum layer 32.

Figure 8:
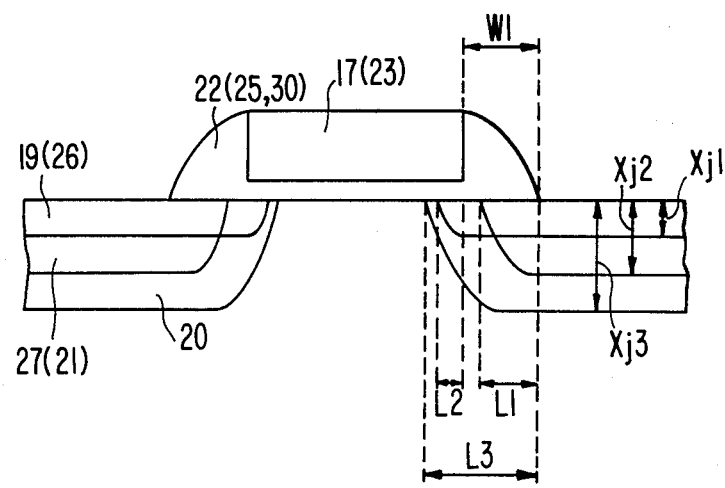
FIG. 8 is a schematic view for explaining exemplary dimensions for the structure of the present invention.

Referring to FIG. 8, various exemplary dimensions for a semiconductor device formed by the present invention will be given. Thus, the width (W1) from an edge of gate electrode 17 (or gate electrodes 23 or 28) to the edge of side wall 22 (or side walls 25 or 30) can be $0.25\mu$. The depth $X_{j1}$ of the $N^-$-type semiconductor layers 19 and 26 can be $0.15\mu$. The depth $X_{j2}$ of the $N^+$-type semiconductor layers 21 and 27 can be $0.2\mu$. The depth $X_{j3}$ of the $N^+$-type semiconductor layer 20 can be $0.5\mu$. The overlapping length $L_1$ between, e.g., side wall spacer 22 and $N^+$-type semiconductor layers 21 and 27 can be $0.14\mu$. The overlapping length $L_2$ between the gates 17 and 16, and the $N^-$-type semiconductor regions 19 and 26, respectively, can be $0.1\mu$. And the overlapping length $L_3$ between gate 17, side wall spacer 22 and $N^+$-type semiconductor layer 20 can be $0.35\mu$.

While, in the above, the invention made by the inventors has been chiefly described with respect to its application to semiconductor devices of the CMOS type which form the background field of utilization, it is not restricted thereto. The present invention is applicable to a memory IC and also a logic IC other than a DRAM as long as a MOSFET of the LDD structure is included in an internal structure. Moreover, it is applicable, generally, to semiconductor devices having MOSFETs of LDD structure together with other MOSFETs, in a semiconductor substrate. Further, it is applicable, not only to CMOSICs, but also to NMOSICs. The LDD structure in the present invention may include, at least, a first semiconductor region having a high impurity concentration, and a second semiconductor region which has an impurity concentration lower than that of the first semiconductor region and which is formed closer to a channel side (gate electrode side) than the first semiconductor region. The first semiconductor region need not be deeper than the second semiconductor region. A bonding pad includes not only a pad for wire bonding, but also a pad for bonding which utilizes a bump electrode or the like. Various semiconductor regions may well be opposite in conductivity type to the foregoing. The concentrations of phosphorus and arsenic can be variously altered within the scope of the purport of the present invention.

While we have shown and described several embodiments in accordance with the present invention, it is understood that the same is not limited thereto but is susceptible of numerous changes and modifications as known to one having ordinary skill in the art and we therefore do not wish to be limited to the details shown and described herein, but intend to cover all such modifications as are encompassed by the scope of the appended claims.

What is claimed is:

1. A method of manufacturing a semiconductor integrated circuit device which has first and second MOSFETs formed on a semiconductor substrate, comprising:

the step of forming gate electrodes of said first and second MOSFETs on said semiconductor substrate;

the step of introducing an impurity of the first conductivity type at a low concentration into at least a region to form said first MOSFET, by employing said gate electrodes as a mask, whereby second semiconductor regions are formed;

the step of forming side wall spacers on two side walls of each of said gate electrodes of said first and second MOSFETs;

the step of introducing phosphorus impurity into a region to form said second MOSFET, by employing at least said gate electrode of said second MOSFET as a mask, whereby third semiconductor regions as source or drain regions of said second MOSFET are formed, said source and drain regions being phosphorus-doped source and drain regions, an impurity concentration of said third semiconductor regions being higher than that of said second semiconductor regions; and the step of introducing an impurity of the first conductivity type into at least said region to form said first MOSFET, by employing said gate electrodes and said side wall spacers as a mask, whereby first semiconductor regions are formed, an impurity concentration of said first semiconductor regions being higher than that of said second semiconductor regions, a source or drain region of said first MOSFET being made of said first and second semiconductor regions.

2. A method of manufacturing a semiconductor integrated circuit device according to claim 1, wherein the impurity concentration of said second semiconductor regions is at most approximately $1 \times 10^{18}/cm^3$.

3. A method of manufacturing a semiconductor integrated circuit device according to claim 2, wherein the impurity concentration of the third semiconductor regions is at least $1 \times 10^{19}/cm^3$.

4. A method of manufacturing a semiconductor integrated circuit device according to claim 1, wherein said second semiconductor regions are formed to be closer to a channel side of the first MOSFET than are said first semiconductor regions.

5. A method of manufacturing a semiconductor integrated circuit device according to claim 1, wherein said first and second MOSFETs are part of an internal circuit and an input/output circuit, respectively, of the integrated circuit device.

6. A method of manufacturing a semiconductor integrated circuit device according to claim 1, wherein the step of introducing phosphorus impurity into a region to form said second MOSFET employs said gate electrode of said second MOSFET and side wall spacers thereof as a mask.

7. A method of manufacturing a semiconductor integrated circuit device according to claim 1, including the further step of forming a silicide layer on the first, second and third semiconductor regions and on the gate electrodes so as to reduce contact resistance of the gate electrodes and semiconductor regions.

8. A method of manufacturing a semiconductor integrated circuit device according to claim 7, wherein said silicide layer is a layer of a silicide of platinum or a refractory metal.

9. A method of manufacturing a semiconductor integrated circuit device according to claim 7, wherein the step of forming the silicide layer includes forming a layer of a metal for forming the silicide on the semiconductor regions and on the gate electrodes, and reacting the metal with the semiconductor regions and the gate electrodes so as to form said silicide layer.

10. A method of manufacturing a semiconductor integrated circuit device according to claim 1, wherein said third semiconductor region includes therein a region which is formed by the same step as that of said second semiconductor region.

11. A method of manufacturing a semiconductor integrated circuit device according to claim 1, wherein said third semiconductor region includes therein a region which is formed by the same step as that of the first semiconductor region.

12. A method of manufacturing a semiconductor integrated circuit device according to claim 1, wherein said third semiconductor regions forming the source or drain region of the second MOSFET are extended so as to form a resistor, one end of said resistor being connected to a bonding pad.

13. A method of manufacturing a semiconductor integrated circuit device according to claim 1, wherein said first and second MOSFETs are N-channel MOSFETs, and said first and second semiconductor regions are respectively formed by introducing arsenic and phosphorus.

14. A method of manufacturing a semiconductor integrated circuit device according to claim 12, wherein the impurity concentration of said third semiconductor regions is at least $1 \times 10^{19}/cm^3$.

15. A method of manufacturing a semiconductor integrated circuit device according to claim 12, wherein said first semiconductor regions are formed in only said first MOSFET.

16. A method of manufacturing a semiconductor integrated circuit device according to claim 10, wherein said impurity introduced in forming said second semiconductor region is phosphorus.

17. A method of manufacturing a semiconductor integrated circuit device which has first and second MOSFETs of N-channel type and a third MOSFET of P-channel type which are formed on a semiconductor substrate, comprising:

the step of forming gate electrodes of said first, second and third MOSFETs on said semiconductor substrate;

the step of forming on said semiconductor substrate a first mask which covers at least a region to form said third MOSFET;

the step of introducing, after forming said first mask, an impurity of a first conductivity type at a low concentration into at least a region to form said first MOSFET, by employing said gate electrodes as a mask, whereby second semiconductor regions are formed;

the step of forming side wall spacers on two side walls of each of said gate electrodes of said first, second and third MOSFETs;

the step of forming on said semiconductor substrate a second mask which covers regions to form said first and third MOSFETs;

the step of introducing, after forming said second mask, phosphorus impurity into a region to form said second MOSFET, by employing said gate electrode and said side wall spacers as a mask, whereby third semiconductor regions as source and drain regions of said second MOSFET are formed, said source and drain regions being phosphorus-doped source and drain regions, an impurity concentration of said third semiconductor regions being higher than that of said second semiconductor regions;

the step of forming on said semiconductor substrate a third mask which covers at least a region to form said third MOSFET;

the step of introducing, after forming said third mask, an impurity of the first conductivity type into at least said region to form said first MOSFET, by employing said gate electrode and said side wall spacers as a mask, whereby first semiconductor regions are formed, an impurity concentration of said first semiconductor regions being higher than that of said second semiconductor regions, a source or drain region of said first MOSFET being made of said first and second semiconductor regions;

the step of forming on said semiconductor substrate a fourth mask which covers regions to form said first and second MOSFETs; and the step of introducing an impurity of a second conductivity type into said region to form said third MOSFET, by employing said gate electrode and said side wall spacers as a mask, whereby fourth semiconductor regions as source and drain regions of said third MOSFET are formed.

18. A method of manufacturing a semiconductor integrated circuit device according to claim 17, wherein said first and second semiconductor regions are respectively formed by introducing arsenic and phosphorus.

19. A method of manufacturing a semiconductor integrated circuit device according to claim 18, wherein said first mask is formed so as to cover said regions to form said third and second MOSFETs.

20. A method of manufacturing a semiconductor integrated circuit device according to claim 18, wherein said third mask is formed so as to cover said regions to form said third and second MOSFETs.

21. A method of manufacturing a semiconductor integrated circuit device according to claim 18, wherein the impurity concentration of said third semiconductor regions is at least $1\times10^{19}/cm^3$.

22. A method of manufacturing a semiconductor integrated circuit device according to claim 17, wherein the first MOSFET of N-channel type and the third MOSFET of P-channel type form an internal circuit, and the second MOSFET of N-channel type forms an input/output circuit, of said semiconductor integrated circuit device.

23. A method of manufacturing a semiconductor integrated circuit device according to claim 17, wherein, in the step of introducing said impurity of a first conductivity type to form said second semiconductor regions, said impurity of a first conductivity type is also introduced into the location of the source and drain regions of said second MOSFET, said impurity of a first conductivity type introduced to form the second semiconductor regions and introduced into the location of the source and drain regions of said second MOSFET being a phosphorus impurity.

24. A method of manufacturing a semiconductor integrated circuit device having first and second MOSFETs formed on a semiconductor substrate, comprising the steps of:

forming a first MOSFET of a first conductivity type on said semiconductor substrate, the forming of the first MOSFET including introducing impurities of a first conductivity type so as to form a first semiconductor region of high impurity concentration and a second semiconductor region having an impurity concentration lower than that of said first semiconductor region, the second semiconductor region being formed closer to a channel side of the first MOSFET than said first semiconductor region, the first and second semiconductor regions forming a source or drain region of the first MOSFET;

forming a second MOSFET of the first conductivity type on the semiconductor substrate, the forming of the second MOSFET including introducing phosphorus impurity so as to form a third semiconductor region having an impurity concentration higher than that of said second semiconductor region, said third semiconductor region being formed by a different step of impurity introduction than the steps of impurity introduction for forming the first and second semiconductor regions, the third semiconductor region forming a source or drain region of the second MOSFET, said source or drain region of the second MOSFET being a phosphorus-doped source or drain region; and connecting said source or drain region of the second MOSFET to a bonding pad.

25. A method of manufacturing a semiconductor integrated circuit device according to claim 24, wherein said first MOSFET of a first conductivity type is part of an internal circuit, and said second MOSFET of the first conductivity type is part of an input/output circuit, of said semiconductor integrated circuit device.

26. A method of manufacturing a semiconductor integrated circuit device according to claim 24, wherein the forming of the second MOSFET further includes introducing phosphorus impurity at the location of the third semiconductor region so as to form a fourth semiconductor region within the third semiconductor region, the fourth semiconductor region having a lower impurity concentration than that of the third semiconductor region.

27. A method of manufacturing a semiconductor integrated circuit device according to claim 26, wherein the second and fourth semiconductor regions are formed simultaneously, each of the second and fourth semiconductor regions including phosphorus impurity.

28. A method of manufacturing a semiconductor integrated circuit device according to claim 26, wherein the impurity concentration of the third semiconductor region is at least $1\times10^{19}$ cm$^{-3}$, and the impurity concentration of the fourth semiconductor region is at most $1\times10^{18}$ cm$^{-3}$.

29. A method of manufacturing a semiconductor integrated circuit device according to claim 26, wherein the forming of the second MOSFET further includes forming a fifth semiconductor region at the location of the third semiconductor region, the fifth semiconductor region being formed on a surface side of the third semiconductor region and shallower than the third semiconductor region, the fifth semiconductor region being spaced from a vertical projection on the substrate of the gate electrode of the second MOSFET, the fifth semiconductor region containing arsenic impurity.

* * * * *